(12) United States Patent
Aoki

(10) Patent No.: US 11,843,244 B2
(45) Date of Patent: Dec. 12, 2023

(54) CURRENT DETECTION CIRCUIT

(71) Applicant: ROHM CO., LTD., Kyoto (JP)

(72) Inventor: Akira Aoki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 103 days.

(21) Appl. No.: 17/460,771

(22) Filed: Aug. 30, 2021

(65) Prior Publication Data

US 2022/0102969 A1 Mar. 31, 2022

(30) Foreign Application Priority Data

Sep. 30, 2020 (JP) ................. 2020-164849

(51) Int. Cl.
*H02H 9/04* (2006.01)
*G01R 19/00* (2006.01)
*H02H 1/00* (2006.01)

(52) U.S. Cl.
CPC ......... *H02H 9/045* (2013.01); *G01R 19/0092* (2013.01); *H02H 1/0007* (2013.01)

(58) Field of Classification Search
CPC ...... H02H 9/045; H02H 1/0007; H02H 3/087; G01R 19/0092
USPC .......................................................... 361/56
See application file for complete search history.

(56) References Cited

U.S. PATENT DOCUMENTS

2009/0261861 A1* 10/2009 Shimada ............ G01R 19/0092 327/52
2018/0178710 A1* 6/2018 Ichikawa ............... H05B 45/10
2021/0048453 A1* 2/2021 Chao .................. H03F 3/45071

FOREIGN PATENT DOCUMENTS

WO WO 2017/022633 2/2017

OTHER PUBLICATIONS

Y.-S. Lee and C.-J. Hsu, "High Accuracy CMOS Current Sensing Circuit for Current Mode Control Buck Converter," 2007 7th International Conference on Power Electronics and Drive Systems, Bangkok, Thailand, 2007, pp. 44-48, doi: 10.1109/PEDS.2007.4487675 (Year: 2007).*

* cited by examiner

*Primary Examiner* — Thienvu V Tran
*Assistant Examiner* — Sreeya Sreevatsa
(74) *Attorney, Agent, or Firm* — Fish & Richardson P.C.

(57) ABSTRACT

The present disclosure provides a current detection circuit having a high detection precision. The current detection circuit includes: a current output type differential amplifier; a first input resistor, configured to be connected between a first input end of the differential amplifier and a first current sense terminal; a second input resistor, configured to be connected between a second input end of the differential amplifier and a second current sense terminal; an output resistor, configured to be connected to an output end of the differential amplifier; a first feedback current path, configured to allow a first feedback current to flow between the first input end and the output end of the differential amplifier; and a second feedback current path, configured to allow a second feedback current to flow between the second current sense terminal and the output end of the differential amplifier.

13 Claims, 10 Drawing Sheets

CURRENT DETECTION CIRCUIT

BACKGROUND

Technical Field

The disclosure of the application relates to a current detection circuit.

Description of the Prior Art

Conventionally, a current detection circuit has been used in various applications of light emitting diode (LED) driver integrated circuits (IC), switch power supply ICs and the like. The current detection circuit may generate a current detection signal that indicates a monitored target current based on a voltage drop of a sense resistor.

Moreover, an example of the prior art related to the contents above may be referred from patent publication 1.

PRIOR ART DOCUMENT

Patent Publication

[Patent document 1] International Publication No. 2017/022633

SUMMARY

Problems to be Solved

However, the detection precision of a conventional current detection circuit needs to be further improved.

It is an object of the disclosure of the application is to provide a current detection circuit with a higher detection precision, in view of the issues discovered by the inventors of the application.

Technical Means for Solving the Problem

For example, a current detection circuit disclosed by the application is configured as below (first configuration), that is, including: a current output type differential amplifier; a first input resistor, configured to be connected between a first input end of the differential amplifier and a first current sense terminal; a second input resistor, configured to be connected between a second input end of the differential amplifier and a second current sense terminal; an output resistor, configured to be connected to an output end of the differential amplifier; a first feedback current path, configured to allow a first feedback current to flow between the first input end and the output end of the differential amplifier; and a second feedback current path, configured to allow a second feedback current to flow between the second current sense terminal and the output end of the differential amplifier.

Moreover, in a possible configuration, in a current detection circuit including the first configuration, the first feedback current and the second feedback current have the same value (second configuration).

In addition, in a possible configuration, in a current detection circuit including the first configuration, an offset is applied to the first feedback current and the second feedback current (third configuration).

In addition, for example, a current detection circuit disclosed by the application may be configured as below (fourth configuration), that is, including: a current output type differential amplifier; a first input resistor, configured to be connected between a first input end of the differential amplifier and a first current sense terminal; a second input resistor, configured to be connected between a second input end of the differential amplifier and a second current sense terminal; a voltage-current (V-I) converter, converting a voltage signal into a current signal; a feedback resistor, configured to determine a gain of the V-I converter; a first reference current path, configured to allow a first reference current to flow between the first current sense terminal and a first output end of the V-I converter; and a second reference current path, configured to allow a second reference current to flow between the second current sense terminal and a second output end of the V-I converter.

In addition, a semiconductor device disclosed by the application may be configured as below (fifth configuration), that is, including: the first current sense terminal; the second current sense terminal; electrostatic protection diodes, individually connected to the first current sense terminal and the second current sense terminal; and the current detection circuit including any one of the first to third configurations.

Moreover, in a possible configuration, a semiconductor device including the fifth configuration further includes: an output element; and an output feedback control unit, driving the output element by a fixed on-time with bottom detection method such that a current detection signal output from the current detection circuit matches a predetermined target value (sixth configuration).

In addition, in a possible configuration, in a semiconductor device including the sixth configuration, the output feedback control unit includes: a slope signal generator, generating a slope signal; an error amplifier, generating an error signal that corresponds to an error between the current detection signal output from the current detection circuit and a predetermined reference signal; a comparator, comparing the slope signal and the error signal to generate a set signal; an on time setting unit, generating a pulse in a reset signal when a predetermined on time has elapsed from a pulse generation timing of the set signal; a controller, generating a control signal for the output element in response to the set signal and the reset signal; and a driver, generating a drive signal for the output element according to the control signal (seventh configuration).

In addition, in a possible configuration, in a semiconductor device including the seventh configuration, the slope signal generator includes a gm amplifier configured to detect a sense voltage appearing between the first current sense terminal and the second current sense terminal, without drawing a current from either of the terminals (eighth configuration).

In addition, in a possible configuration, in a semiconductor device including the seventh or eighth configuration, the on time setting unit includes a source follower configured to detect a terminal voltage appearing in the second current sense terminal, without drawing a current from the first current sense terminal and the second current sense terminal (ninth configuration).

In addition, a module disclosed by the application may be configured as below (tenth configuration), that is, including the semiconductor device of any of the sixth to ninth configuration; an inductor, a sense resistor and a load, connected in series with the output element; a first current limiting resistor, connected between the first current sense terminal and the sense resistor; and a second current limiting resistor, connected between the second current sense terminal and the sense resistor.

Moreover, in a possible configuration, in a module including the tenth configuration, the load includes a light emitting diode element (eleventh configuration).

In addition, in a possible configuration, a module including the eleventh configuration further includes a matrix manager configured to arbitrarily switch the number of series stages of the light emitting diode element (twelfth configuration).

Effects of the Disclosure

A current detection circuit having a higher detection precision is provided according to the disclosure of the application.

DETAILED DESCRIPTION OF THE EMBODIMENTS

<Light Emitting Diode (LED) Light Module (First Embodiment)>

Figure 1:
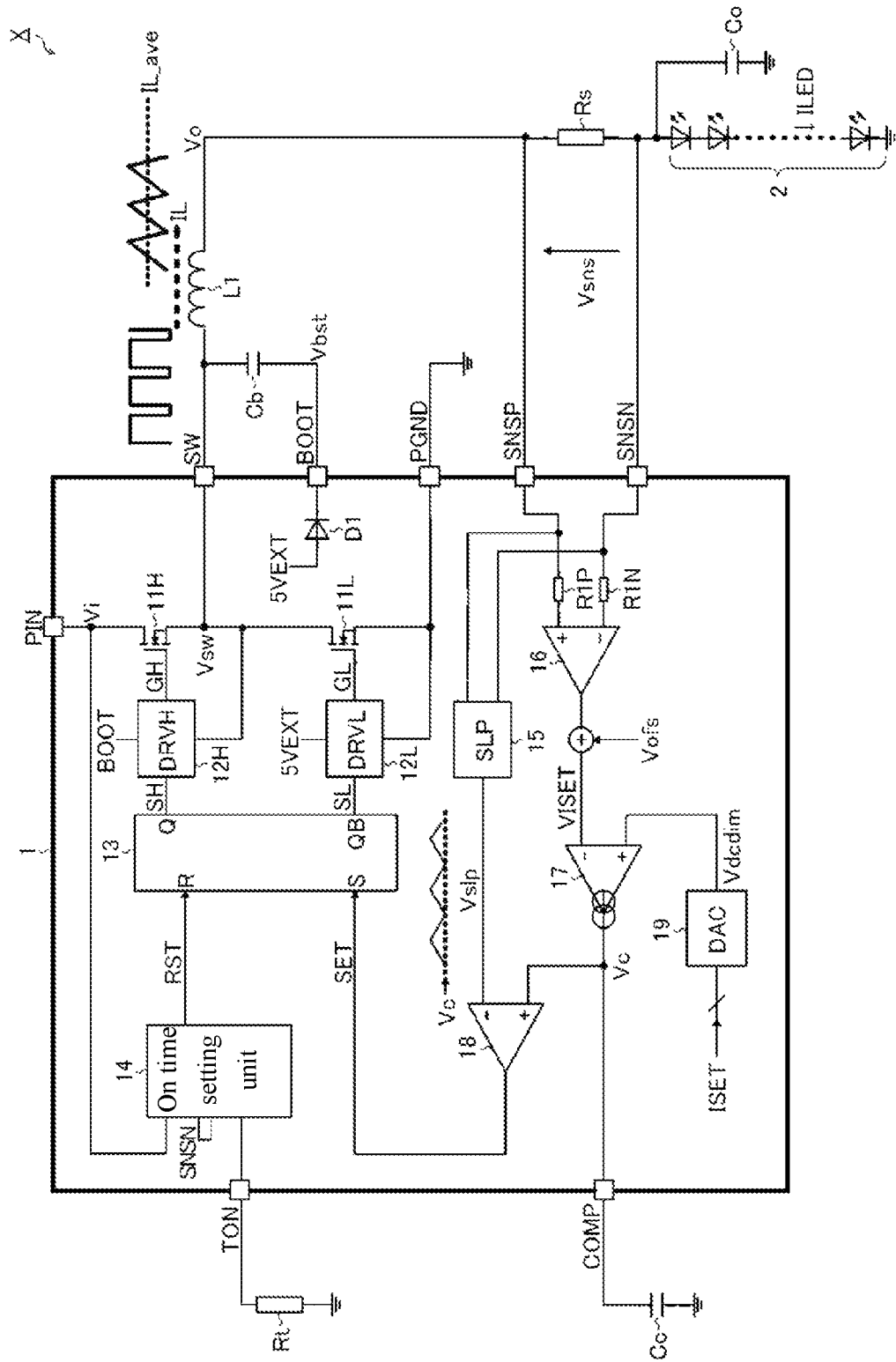
FIG. 1 is a diagram of a light emitting diode (LED) light module according to a first embodiment.

FIG. 1 shows a diagram of an LED light module according to a first embodiment (fundamental configuration). An LED light module X of the first embodiment includes: an LED driver integrated circuit (IC) 1, an LED string 2 (equivalent to multiple LEDs connected in series), various discrete components (capacitors Cb, Cc and Co, an inductor L1, a resistor Rt and a sense resistor Rs).

The LED driver IC 1 is a semiconductor device that reduces an input voltage Vi of a power system and supplies power to the LED string 2. Moreover, the LED driver IC 1 functions as a mechanism for ensuring electrical connections with the outside of the IC, and has multiple external terminals (pin PIN, pin SW, pin BOOT, pin PGND, pin SNSP, pin SNSN, pin TON and pin COMP).

The pin PIN is a power system power terminal. The pin SW is a switch output terminal. The pin BOOT is a bootstrap capacitor connection terminal for high gate drive. The pin PGND is a power system ground terminal. The pin SNSP is a first current sense terminal (+). The pin SNSN is a second current sense terminal (−). The pin TON is a resistance connection terminal for on time setting. The pin COMP is a capacitor connection terminal for phase compensation.

The pin PIN is connected to a power system power terminal (an application terminal of the input voltage Vi). The pin SW is connected to a first terminal of an inductor L1. A second terminal of the inductor L1 is connected to a first terminal of the sense resistor Rs. A second terminal of the sense resistor Rs is connected to the anode of the LED string 2. The cathode of the LED string 2 is connected to a ground terminal. The capacitor Cb (bootstrap capacitor) is connected between the pin BOOT and the pin SW. The capacitor Co (output capacitor) is connected between the anode of the LED string 2 and the ground terminal. The first terminal (high potential terminal) of the sense resistor Rs is connected to the pin SNSP. A second terminal (low potential terminal) of the sense resistor Rs is connected to the pin SNSN. The pin PGND is connected to the power system ground terminal. A resistor Rt (on time setting resistor) is connected between the pin TON and the ground terminal. The capacitor Cc (phase compensation capacitor) is connected between the pin COMP and the ground terminal.

<LED Driver IC>

Referring to FIG. 1, the circuit configuration of the LED driver IC 1 is described below. The LED driver IC 1 serves as a mechanism for driving the LED string 2, and is formed by integrating a high-side switch 11H, a low-side switch 11L, a high-side driver 12H, a low-side driver 12L, a controller 13, an on time setting unit 14, a slope signal generator 15, a current sense amplifier 16, an error amplifier 17, a comparator 18, a digital-to-analog converter (DAC) 19 and a bootstrap diode D1. Alternatively, the LED driver IC 1 may also be integrated with constituting components other than those above (such as a temperature detection circuit and various protection circuits).

The high-side switch 11H is connected between the pin PIN and the pin SW, and is turned on/off according to a high-side gate signal GH. Moreover, the high-side switch 11H is suitably implemented by such as an N-channel type metal oxide semiconductor field effect transistor (NMOSFET). In this case, the high-side switch 11H is turned on when GH=H (=BOOT) and turned off when GH=L (=SW). Moreover, a P-channel type metal oxide semiconductor field effect transistor (PMOSFET) may also be used as the high-side switch 11H instead of an NMOSFET. In this case, the bootstrap diode D1, the capacitor Cb and the pin BOOT do not need to be used.

The low-side switch 11L is connected between the pin SW and the pin PGND and is turned on/off according to a low-side gate signal GL. Moreover, the low-side switch 11L is suitably implemented by such as an NMOSFET. In this case, the low-side switch 11L is turned on when GL=H (=5VEXT) and turned off when GL=L (=PGND).

The high-side switch 11H and the low-side switch 11L in the connection above form a half-bridge output stage that outputs a square wave switch voltage Vsw from the pin SW. That is to say, the high-side switch 11H is equivalent to an output element, and the low-side switch 11L is equivalent to a synchronous rectifier element. Moreover, the inductor L1, the sense resistor Rs and the LED string 2 become a state of being connected in series with the high-side switch 11H. Moreover, in the drawing, a synchronous rectifying half-bridge output stage is given as an example; however, when diode rectification is used, the low-side switch 11L may be implemented by a diode.

The high-side driver 12H generates a high-side gate signal GH according to a high-side control signal SH input from the controller 13. In addition, a high level of the high-side gate signal GH becomes a boost voltage Vbst (≈Vsw+5VEXT) appearing in the pin BOOT. On the other hand, a low level of the high-side gate signal GH becomes the switch voltage Vsw appearing in the pin SW.

The low-side driver 12L generates a low-side gate signal GL according to a low-side control signal SL input from the controller 13. Moreover, a high level of the low-side gate signal GL becomes the constant voltage 5VEXT (an internal power voltage or another external input voltage). On the other hand, a low level of the low-side gate signal GL becomes a terminal voltage (a power system ground voltage) of the pin PGND.

The controller 13 includes, for example, a reset-set (RS) trigger that accepts a set signal SET and a reset signal RST, and generates the high-side control signal SH and the low-side control signal SL, such that the high-side switch 11H and the low-side switch 11L are turned on/off in a complementary manner.

More specifically, the controller 13 generates the high-side control signal SH and the low-side control signal SL, so as to turn on the high-side switch 11H and turn off the low-side switch 11L on a rising timing of the set signal SET, and on the other hand turn off the high-side switch 11H and turn on the low-side switch 11L at a rising timing of the reset signal RST.

The expression "in a complementary manner" in the description should be understood as not only including a case in which the respective turning on/off states of the high-side switch 11H and the low-side switch 11L are totally opposite, but also a case of configuring a simultaneous turn off time (idle time) for preventing a through current.

The on time setting unit 14 has the reset signal RST rise to a high level when a predetermined on time Ton has elapsed from the rising timing of the set signal SET (and the turn-on timing of the high-side switch 11H). Moreover, the on time setting unit 14 also has a function of arbitrarily setting the on time Ton according to a resistance value of the resistor Rt connected to the pin TON. In addition, the on time setting unit 14 also has a function of varying the on time Ton by suppressing varying of a switch frequency Fsw according to respective terminal voltages of the pin PIN and the pin SNSN.

The slope signal generator 15 detects an inter-terminal voltage (=a sense voltage Vsns generated between two terminals of the sense resistor Rs) between the pin SNSP and the pin SNSN, and generates a slope signal Vslp including information of an inductor current IL (an alternating-current (AC) component). Moreover, the slope signal Vslp gets higher as the inductor current IL increases, and the slope signal Vslp gets lower as the inductor current IL decreases.

The current sense amplifier 16 (equivalent to a current detection circuit) amplifies the sense voltage Vsns and generates a current detection signal VISET. The current detection signal VISET gets higher as an output current ILED (=an average inductor current IL_ave) flowing in the sense resistor Rs increases, and the current detection signal VISET gets lower as the output current ILED decreases. Moreover, an arbitrary offset voltage Vofs (in several hundreds of mV) may also be applied to the current detection signal VISET.

The error amplifier 17 outputs a current corresponding to a difference, and charges and discharges the capacitor Cc to accordingly generate an error signal Vc, wherein the difference is a difference between an analog dimming signal Vdcdim (equivalent to a predetermined reference signal) input to a non-inverting input end (+) and the current detection signal VISET input to an inverting input end (−). Moreover, the error signal Vc rises when VISET<Vdcdim, and lowers when VISET>Vdcdim.

The comparator 18 compares the slope signal Vslp input to the inverting input end (−) and the error signal Vc input to the non-inverting end (+), and generates the set signal SET. The set signal SET becomes a low level when Vc<Vslp, and becomes a high level when Vc>Vslp. Thus, the rising timing of the set signal SET and (and the turn-on timing of the high-side switch 11H) becomes more behind time as the error signal Vc gets lower, and conversely, the rising timing of the set signal SET becomes more ahead of time as the error signal Vc gets higher.

The DAC 19 converts an m-bit (for example, m=10) digital dimming signal ISET externally input to the LED driver IC 1 into the analog dimming signal Vdcdim.

Moreover, the constituting components including the high-side driver 12H and low-side driver 12L, the controller 13, the on time setting unit 14, the slope signal generator 15, the current sense amplifier 16, the error amplifier 17, the comparator 18 and the DAC 19 function as an output feedback control unit, which drives the high-side switch 11H and the low-side switch 11L in a complementary manner by a fixed on-time with bottom detection method, such that the output current ILED output from the switch output terminal SW to the LED string 2 matches a predetermined target value.

<Output Feedback Control>

Figure 2:
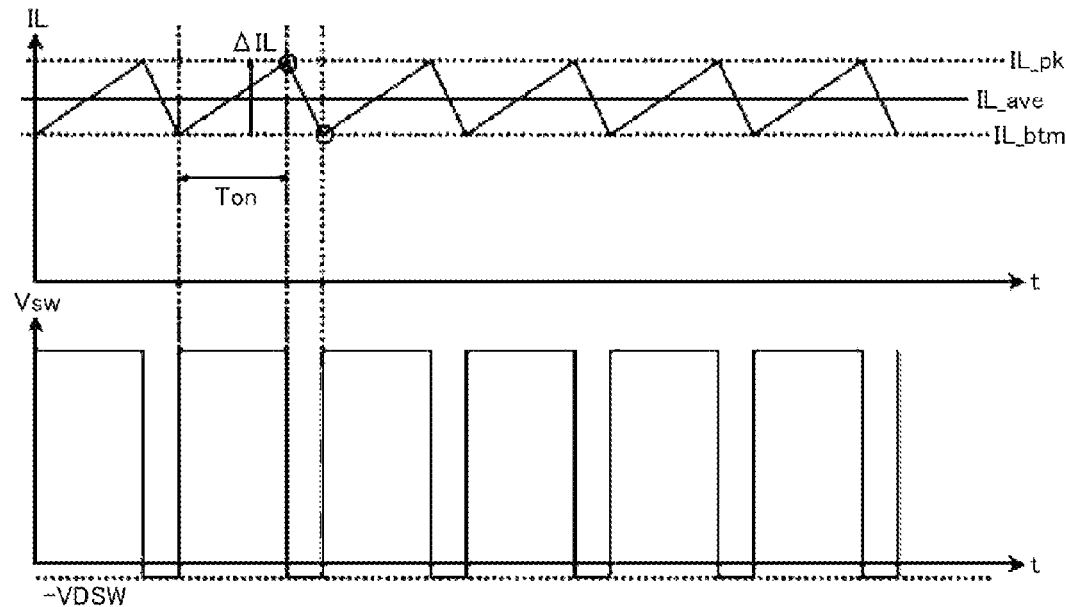
FIG. 2 is a diagram of output feedback control of a fixed on-time with bottom detection method.

FIG. 2 shows a diagram of output feedback control of a fixed on-time with bottom detection method, and the inductor current IL and the switch voltage Vsw are depicted in order from top to bottom.

During the off time of the high-side switch 11L and the on time of the low-side switch 11L, the switch voltage Vsw becomes a low level (=a negative voltage−VDSW generated between the drain and the source of the low-side switch 11L). At this point, the inductor current IL flowing from the pin PGND through the low-side switch 11L to the pin SW decreases along with energy release of the inductor L1.

Thus, when the inductor current IL reduces to a lower limit IL_btm corresponding to the error signal Vc, Vc>Vslp and the set signal SET rises to a high level. As a result, the high-side switch 11H is turned on and the low-side switch 11L is turned off. At this point, because the switch voltage Vsw becomes a high level (≈Vi), the inductor current IL flowing from the pin PIN through the high-side switch 11L to the pin SW increases.

Then, when a predetermined on time Ton has elapsed, the reset signal RST rises to a high level, the high-side switch 11H is turned off, and the low-side switch 11L is turned on, and so the inductor current IL again changes from increasing to decreasing. As a result, the inductor current IL becomes ripples repeatedly increasing and decreasing between a peak value IL_pk and the lower limit IL_btm.

Herein, the lower limit IL_btm of the inductor current IL varies according to the difference between the current detection signal VISET (equivalent to the average inductor current IL_ave) and the analog dimming signal Vdcdim (equivalent to a target value of the average inductor current IL_ave). Moreover, a ripple amplitude ΔIL of the inductor current IL (=IL_pk-IL_btm) is determined according to the on time Ton.

Thus, in the LED driver IC 1, output feedback control of a fixed on-time with bottom detection method is performed by repeating the series of operations, so that the average inductor current IL_ave (and the output current ILED) matches a predetermined target value.

In addition, the method of output feedback control on the LED driver IC 1 is not limited to the method above. For example, a fixed off-time with peak detection method may be used instead of the fixed on-time with bottom detection method; alternatively, a hysteresis window may also be used. Further, in an application that does not demand of a high-speed response, a linear control method such as pulse-width modulation (PWM) control method may also be used.

<LED Light Module (Second Embodiment)>

Figure 3:
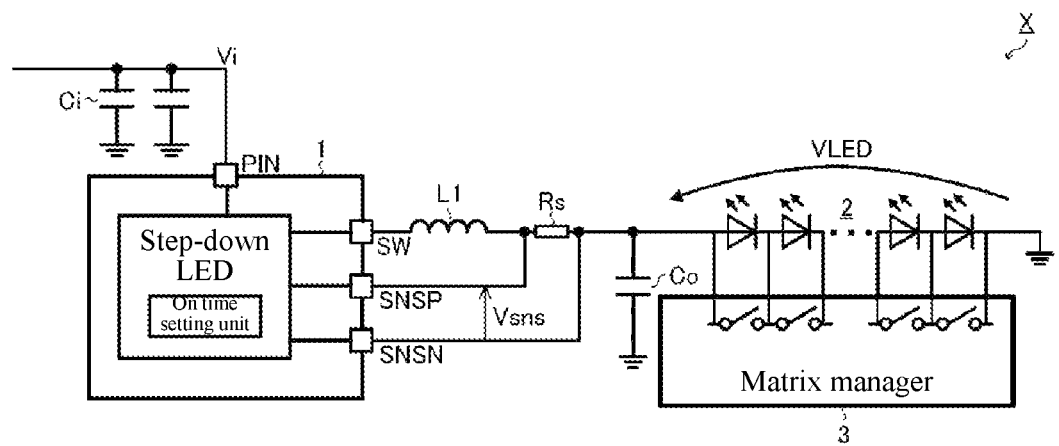
FIG. 3 is a diagram of an LED light module according to a second embodiment.

FIG. 3 shows a diagram of an LED light module according to a second embodiment. The LED light module X of the second embodiment is based on the first embodiment (FIG. 1), and further includes a matrix manager 3. Moreover, in the drawing, a capacitor Ci (=an input capacitor) connected between the pin PIN and the ground terminal of the LED driver IC 1 is explicitly depicted.

The matrix manager 3 includes multiple switch elements respectively connected in parallel to the multiple LED elements forming the LED string 2, and is capable of arbitrarily switching the number of series stages of the LED elements (the number of lit lights).

Figure 4:
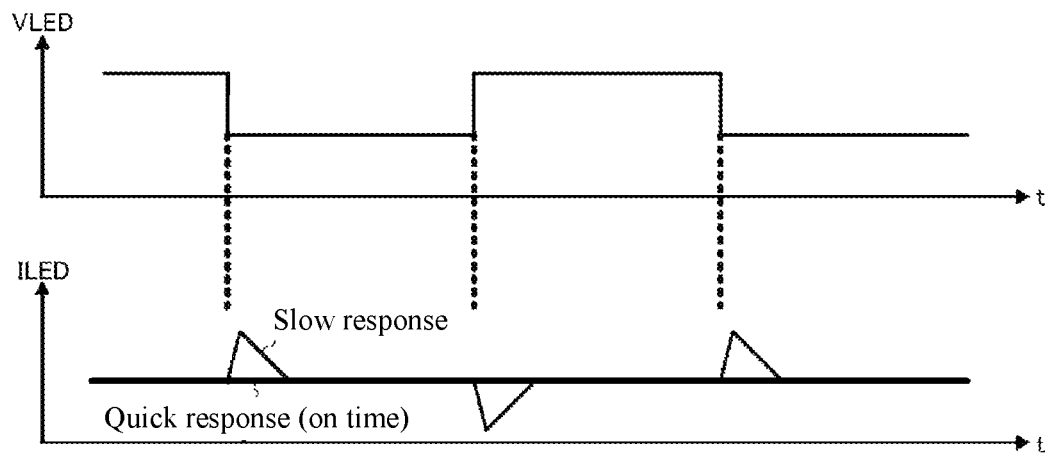
FIG. 4 is a diagram of response performance needed by an LED driver integrated circuit (IC).

FIG. 4 shows a diagram of response performance needed by the LED driver IC 1 in the LED light module X of the second embodiment, and an inter-terminal voltage VLED (=a total of forward drop voltage in the LED element in a light-on state) of the LED string 2 and an output current ILED are depicted in order from top to bottom.

In the LED light module X of the second embodiment, in contribution to the matrix manager 3 added, among the lit lights of the LED string 2, the number of lit lights of the LED elements (and the voltage VLED between two terminals of the LED string 2) changes drastically.

Thus, in order to individually light the LED elements by a certain brightness level, the response speed of the LED driver IC 1 needs to be increased; that is, even if the number of lit lights of the LED elements changes, a stable and continual constant output current ILED needs to be supplied.

Hence, the output feedback control method of the LED driver IC 1 is ideally implemented by a non-linear control method (for example, a fixed on-time with bottom detection method) having outstanding response performance. In addition, when a non-linear control method is used, since the average inductor current IL_ave needs to be detected, a sense resistor Rs is placed behind the inductor L1 in a general configuration, and the sense voltage Vsns generated between the two terminals is detected using the LED driver IC 1.

<Open-Circuit/Short-Circuit Tests of Load>

Figure 5:
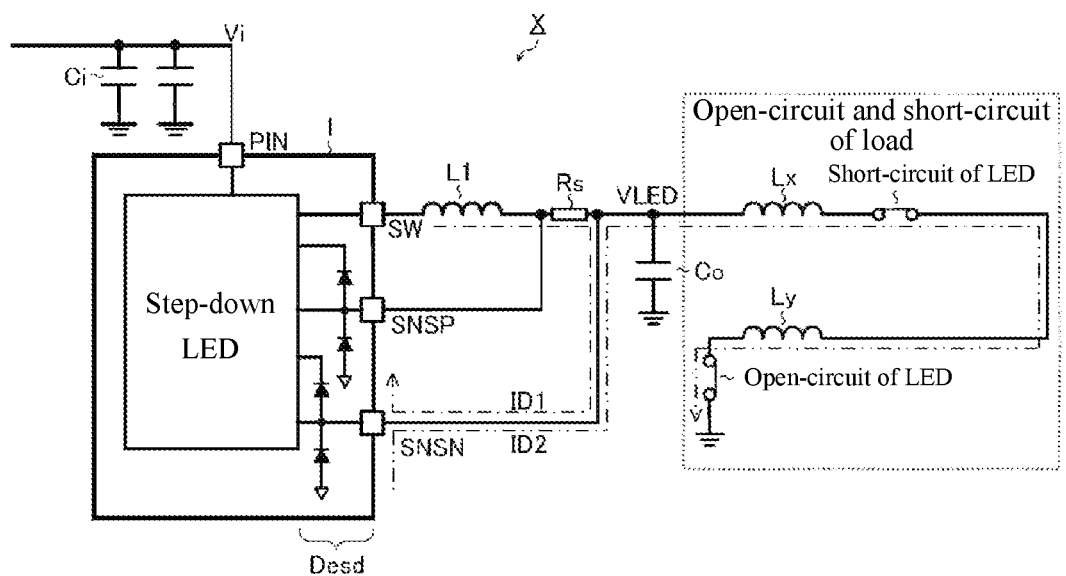
FIG. 5 is a diagram of paths of flowing inrush currents in open-circuit/short-circuit tests of a load.
Figure 6:
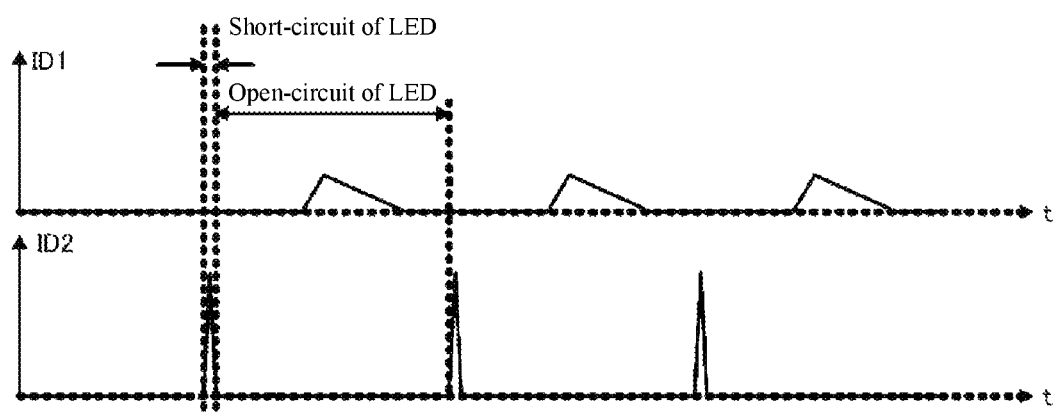
FIG. 6 is a diagram of waveforms of flowing inrush currents in open-circuit/short-circuit tests of a load.

FIG. 5 and FIG. 6 respectively show diagrams of paths and waveforms of flowing inrush currents ID1 and ID2 in open-circuit/short-circuit tests of a load.

First of all, the open-circuit test of the load is discussed. When open-circuit of the lit LED elements in the LED string 2 occurs, a current path toward the LED string 2 is cut off. Thus, the capacitor Co is charged by the counter electromotive force of the inductor L1, and overshoot is produced. As a result, the inrush current ID1 returns to the power supply terminal through an electrostatic protection diode Desd (particularly a high-side electrostatic protection diode connected between the pin SNSN and the power supply terminal) built-in the LED driver IC 1.

Moreover, when the LED driver IC 1 adopts a non-linear control method (for example, a fixed on-time with bottom detection method), the inductance value of the inductor L1 is set to be a greater value (tens to hundreds of μH) relative to a capacity value (several μf) of the output capacitor Co. Hence, the energy accumulated in the inductor L1 is larger, and the inrush current ID1 of several A returns within a longer period of time. Consequently, the upper-side electrostatic protection diode Desd having a current ability of only tens of mA is damaged.

Secondly, the short-circuit test of the load is discussed. For example, when the LED light module X is used for an in-vehicle purpose, the LED driver IC 1 and the LED string 2 are mounted on different substrates. Moreover, the individual substrates are connected by wire harnesses of approximately 1 m to 1.5 m. Hence, the wire harnesses contain parasitic inductance components Lx and Ly (approximately 1 μH) that cannot be overlooked.

Thus, when short-circuit of the LED elements occurs (including switching control of the matrix manager 3 for the number of lit lights), energy is injected from the capacitor Co into the parasitic inductance components Lx and Ly, such that the inrush current ID2 of tens of A instantaneously flows from the ground terminal through an electrostatic protection diode Desd (particularly a low-side electrostatic protection diode connected between the pin SNSN and the ground terminal) built-in the LED driver IC 1. Consequently, the lower-side electrostatic protection diode Desd having a current ability of only tens of mA is damaged.

<LED Light Module (Third Embodiment)>

Figure 7:
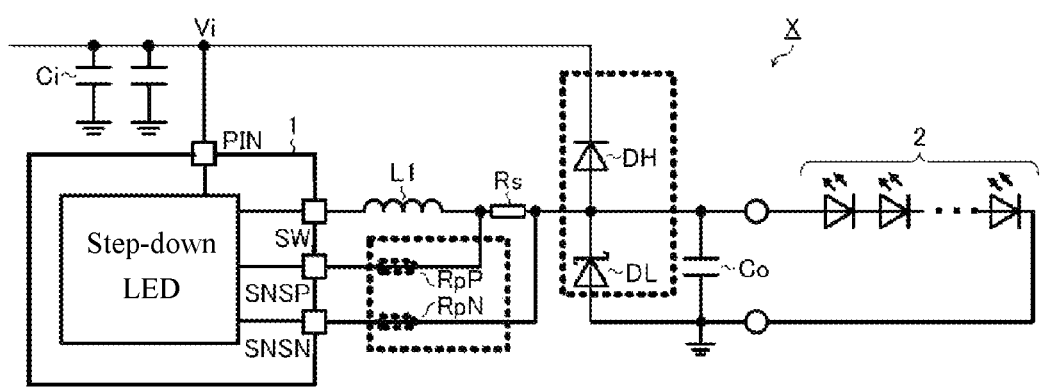
FIG. 7 is a diagram of an LED light module according to a third embodiment.

FIG. 7 shows a diagram of an LED light module according to a third embodiment. In the LED light module X of the third embodiment, surge protection diodes DH and DL are placed outside the LED driver IC 1, and serve as a mechanism for protecting the electrostatic protection diode Desd (referring to FIG. 5) from influences of inrush currents.

Moreover, the surge protection diode DH is connected between the anode of the LED string 2 and the application terminal of the input voltage Vi. In addition, the surge protection diode DL is connected between the anode of the LED string 2 and the ground terminal.

According to the circuit configuration above, even if open-circuit/short-circuit of the LED elements occurs, the anode potential of the LED string 2 can be limited within a certain range, hence protecting the electrostatic protection diode Desd of the LED driver IC 1.

However, each channel requires two more costly surge protection diodes DH and DL, and so the increased cost (including financing cost of components and transportation cost of components) of the LED light module X may become problematic. In addition, the area needed for mounting the components on the substrate is also increased.

On the other hand, instead of considering to provide the external surge protection diodes DH and DL, cheaper and smaller current limiting resistors RpP and RpN (approximately 1 kΩ) are placed externally at the pin SPSN and the pin SNSN of the LED driver IC 1, respectively, so as to accordingly suppress the inrush currents flowing in the electrostatic protection diode Desd and release the inrush currents through the electrostatic protection diode Desd to the power supply terminal and the ground terminal.

Moreover, the current limiting resistor RpP is connected between the pin SNSP and a first terminal (a high potential terminal) of the sense resistor Rs. In addition, the current limiting resistor RpN is connected between the pin SNSN and a second terminal (a low potential terminal) of the sense resistor Rs.

However, if the current limiting resistors RpP and RpN are simply placed externally, the detection precision of the output current ILED in the LED driver IC 1 is reduced. Comprehensive study is carried out with respect to the aspect above.

Figure 8:
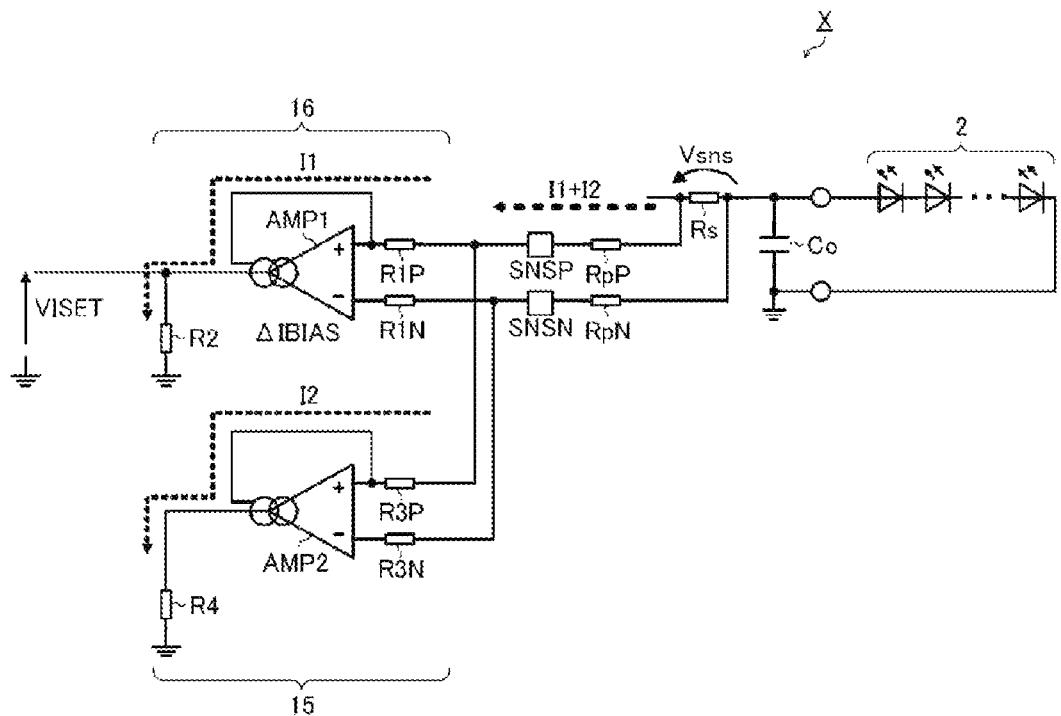
FIG. 8 is a diagram of a gain error generated in a current sense amplifier.

FIG. 8 shows a diagram of a gain error generated in a current sense amplifier 16 due to the current limiting resistors RpP and RpN placed externally.

As shown in the diagram, the current sense amplifier 16 includes a current output type differential amplifier AMP1, input resistors R1P and R1N, and an output resistor R2. A non-inverting input end (+) of the differential amplifier AMP1 is connected to a first terminal of the input resistor R1P (for example, 10 kΩ). A second terminal of the input resistor R1P is connected to the pin SNSP. An inverting input end (−) of the differential amplifier AMP1 is connected to a first terminal of the input resistor R1N (for example, 10 kΩ). A second terminal of the input resistor R1N is connected to the pin SNSN. An output end of the differential amplifier AMP1 is connected to a first terminal of the output resistor R2 (for example, 120 kΩ), and is at the same time connected to the non-inverting input end (+) of the differential amplifier AMP1. A second terminal of the output resistor R2 is connected to the ground terminal.

In addition, the slope signal generator 15 includes a current output type differential amplifier AMP2, input resistors R3P and R3N, and an output resistor R4. A non-inverting input end (+) of the differential amplifier AMP2 is connected to a first terminal of the input resistor R3P (for example, 10 kΩ). A second terminal of the input resistor R3P is connected to the pin SNSP. An inverting input end (−) of the differential amplifier AMP2 is connected to a first terminal of the input resistor R3N (for example, 10 kΩ). A second terminal of the input resistor R3N is connected to the pin SNSN. An output end of the differential amplifier AMP2 is connected to a first terminal of the output resistor R4 (for example, 10 kΩ), and is at the same time connected to the non-inverting end input end (+) of the differential amplifier AMP2. A second terminal of the output resistor R4 is connected to the ground terminal.

Moreover, a feedback current I1 flows between the non-inverting input end (+) and the output end of the differential amplifier AMP1. The feedback current I1 is necessary to perform high-precision current feedback control. In addition, a feedback current I2 flows between the non-inverting input end (+) and the output end of the differential amplifier AMP2.

As such, the common current sense amplifier 16 for performing non-linear control of the average inductor current IL_ave includes the differential amplifier AMP1, which includes a floating input stage capable of amplifying the sense voltage Vsns by means of rail-to-rail (between a power potential and a ground potential). The term "floating" herein means floating from the ground potential (separated in terms of potential).

Assuming that the current limiting resistors RpP and RpN are not correspondingly placed externally at the pin SNSP and the pin SNSN, respectively, a gain G of the current sense amplifier 16 is solely determined by a ratio of the input resistor R1 to the output resistor R2 (G=R2/R1, for example, G=12).

On the other hand, when the current limiting resistors RpP and RpN are correspondingly placed externally, due to a terminal current (I1+I2) flowing in the pin SNSP, a change occurs in a differential input current difference ΔIBIAS of the differential amplifier AMP1 (=a difference between input currents respectively flowing at the non-inverting input end (+) and the inverting input end (−) of the differential amplifier AMP1).

As a result, the gain G of the current sense amplifier 16 is no longer determined solely according to the ratio of the input resistor R1 to the output resistor R2, so the current detection signal VISET (=Vsns·R2·R3/(R1·R3+R3·Rp+Rp·R1)) greatly deviates from the original value (=Vsns·R2/R1). Particularly, the change in the current detection signal VISET becomes larger as the feedback currents I1 and I2 increase respectively.

In addition, the input resistor R1 and the output resistor R2 built in the LED driver IC 1 are mutually matching, and hence operate by way of eliminating respective temperature characteristics. However, the current limiting resistors RpP and RpN placed externally have completely different temperature coefficients from those of the input resistor R1 and the output resistor R2, and further contain respective manufacturing differences. Therefore, a larger difference occurs in the temperature characteristics of the final current detection signal VISET.

Moreover, trimming of the input resistor R1 is taken into consideration so that a combined resistance value of the input resistor R1 and the current limiting resistor RpP is consistently a constant value. However, the chip size of the LED driver IC 1 also becomes extremely large, and this means that such approach may not be a practical solution.

<LED Light Module (Fourth Embodiment)>

Figure 9:
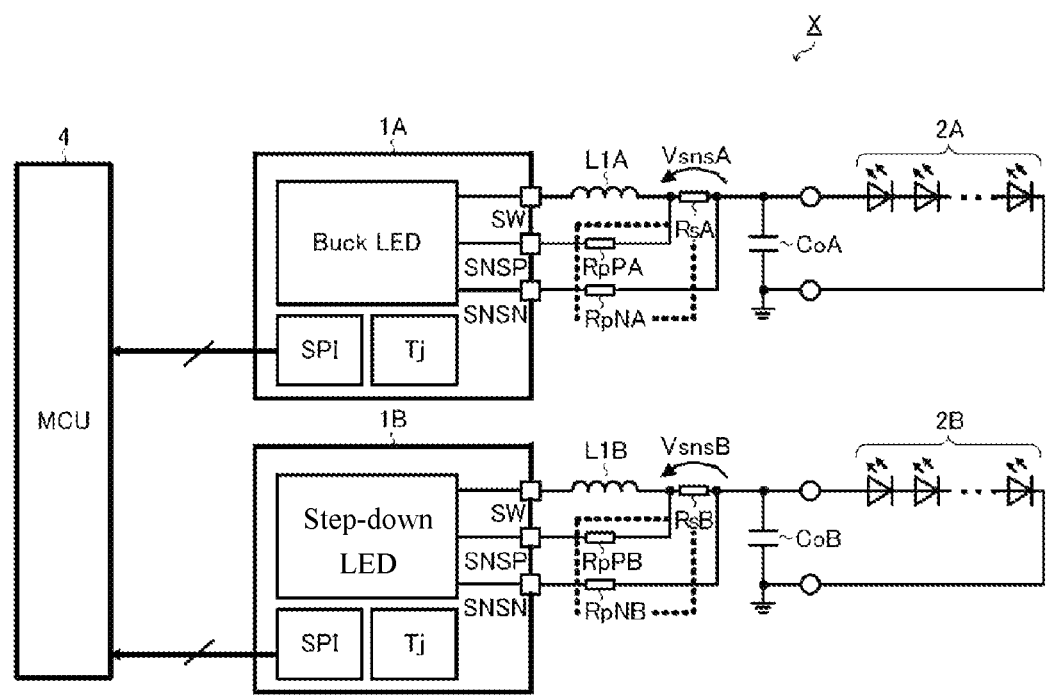
FIG. 9 is a diagram of an LED light module according to a fourth embodiment.

FIG. 9 shows a diagram of an LED light module according to a fourth embodiment. In the configuration of the LED light module X of the fourth embodiment, the constituting components (the LED driver IC 1, the LED string 2, the inductor L1, the capacitor Co, the sense resistor Rs and the current limiting resistors RpP and RpN) of two channel components (in the drawing, constituting elements denoted with suffixes A and B for clear representation) are provided, and a microcontroller unit (MCU) 4 is used to control both of the channels.

Moreover, LED driver ICs 1A and 1B include, in addition to respective buck converters for supplying power to respective LED strings 2A and 2B, temperature detection units that detect internal junction temperatures Tj and communication units that perform serial peripheral interface (SPI) communication with the MCU 4.

Herein, the problem caused by externally placed current limiting resistors RpPA and RpNA and current limiting resistors RpPB and RpNB is respective reduced current detection precisions (particularly temperature drift) of the LED driver ICs 1A and 1B.

A method below is considered as a strategy for eliminating the problem above; that is, the respective internal junction temperatures Tj of the LED driver ICs 1A and 1B are monitored by the MCU 4, and respective detection results of sense voltages VsnsA and VsnsB are dynamically and constantly corrected according to the monitoring results.

Figure 10:
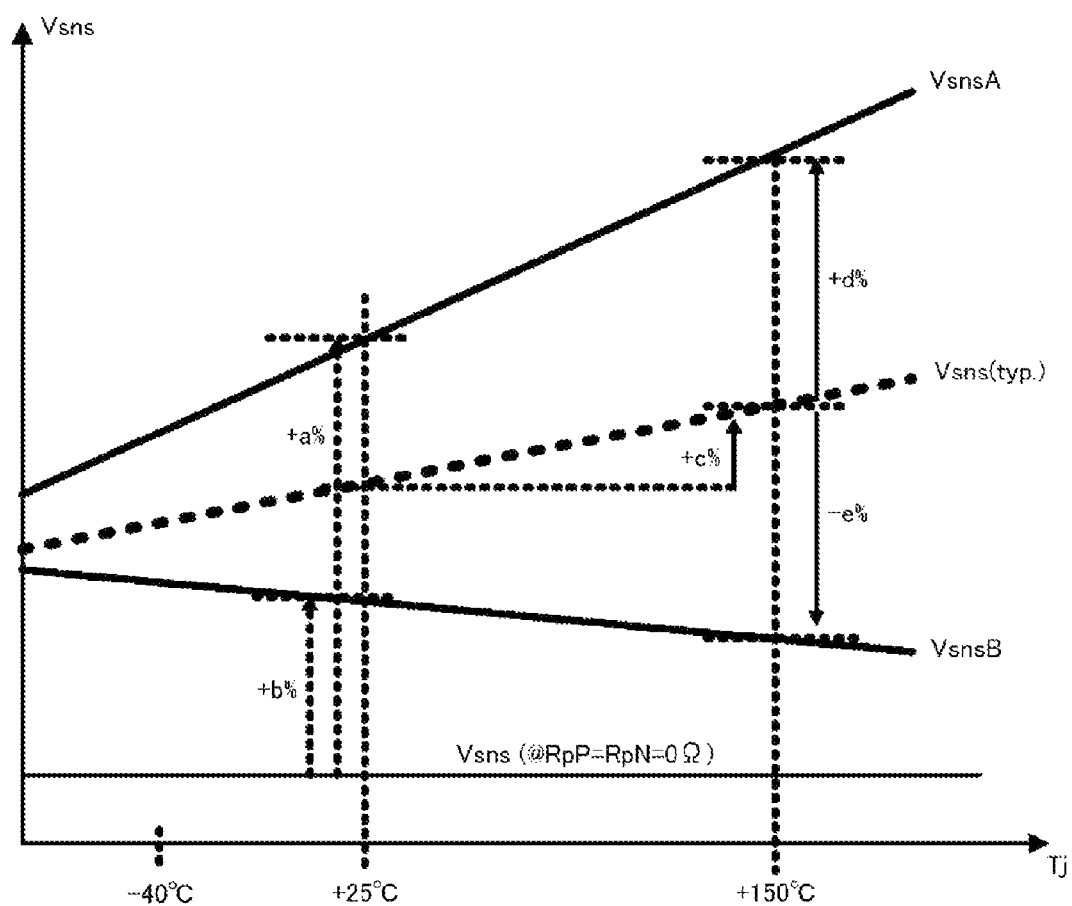
FIG. 10 is a diagram of temperature characteristics of a current detection signal.

FIG. 10 shows a diagram of temperature characteristics of a detection result of the sense voltage Vsns (equivalent to the current detection signal VISET). Moreover, a thick solid line VsnsA represents the detection result of the sense voltage VsnsA in the LED driver IC 1A. In addition, a thick solid line VsnsB represents the detection result of the sense voltage VsnsB in the LED driver IC 1B. On the other hand, a thin solid line Vsns (@ RpP=RpN=0Ω) represents the detection result of the sense voltage Vsns when neither of the current limiting resistors RpP and RpN is placed externally. In addition, the solid dotted line Vsns (typ.) represents temperature characteristics of a correction reference in the MCU 4.

As shown in the drawing, the respective detection results of the sense voltages VsnsA and VsnsB have mutually different temperature characteristics. For example, when Tj=25° C., the respective detection results of the sense voltages VsnsA and VsnsB are shifted by +a % and +b % (where a≠b) compared to when there are no externally placed resistors.

Thus, assuming that +c % (where c≠a and c≠b) of the temperature characteristics is used as the correction reference, the respective temperature characteristics of the sense voltages VsnsA and VsnsB cannot be fully eliminated even if the respective detection results thereof are dynamically corrected using the MCU 4. According to the drawing, within a total temperature range (−40° C. to +150° C.), ±(d+e) % of temperature drift at most remains between the LED driver ICs 1A and 1B.

In addition, to dynamically and constantly correct the respective detection results of the sense voltages VnsA and VsnsB using the MCU 4, a read/write command sequence needs to be persistently executed, and so the load of the MCU is also increased.

<LED Light Module (Fifth Embodiment)>

Figure 11:
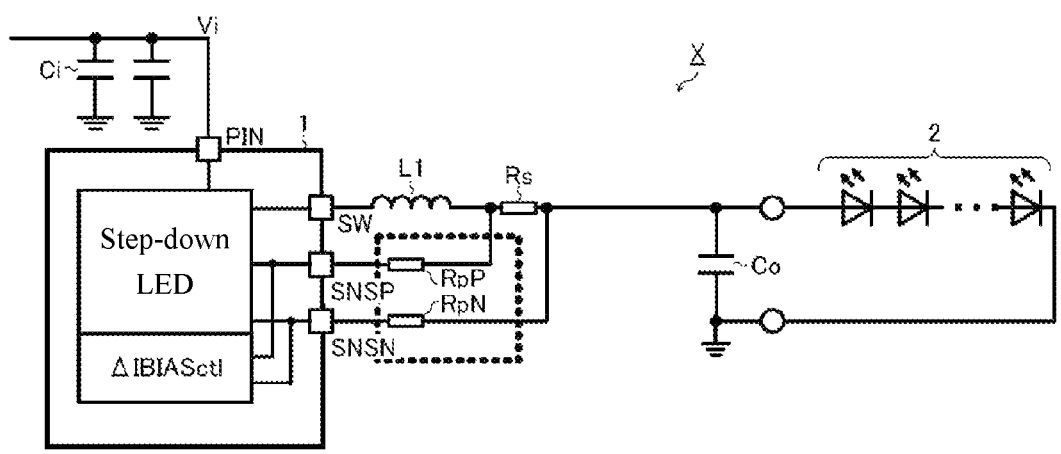
FIG. 11 is a diagram of an LED light module according to a fifth embodiment.

FIG. 11 shows a diagram of an LED light module according to a fifth embodiment. In the LED light module X of the fifth embodiment, the LED driver IC 1 includes a function unit (ΔIBIASct1) for reducing the differential input current difference ΔIBIAS of the differential amplifier AMP1 (referring to FIG. 8). The differential amplifier AMP1 forms the current sense amplifier 16, and attempts to reduce the gain error in the current sense amplifier 16 even if the current limiting resistors RpP and RpN are placed externally.

Figure 12:
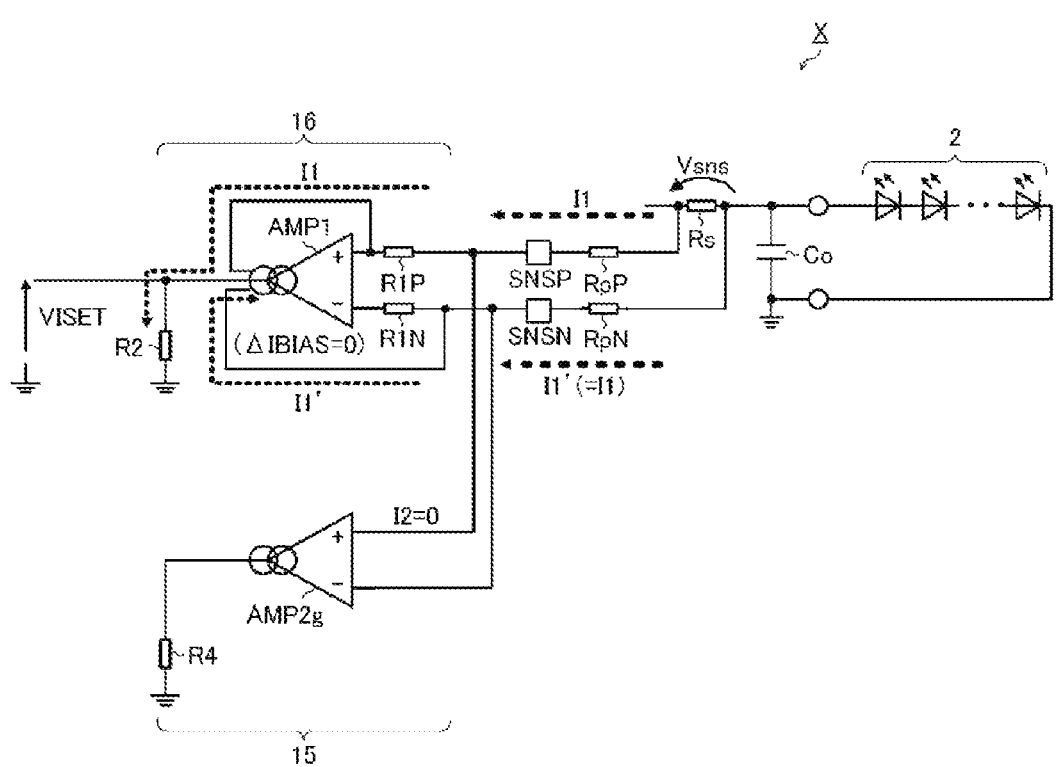
FIG. 12 is a diagram of eliminating a gain error from a current sense amplifier.

FIG. 12 shows a diagram of eliminating the gain error from the current sense amplifier 16. As shown in the drawing, in the LED driver IC 1 of the fifth embodiment, the current sense amplifier 16 has a first feedback current path configured to allow the feedback current I1 to flow between the non-inverting end (+) and the output end of the differential amplifier AMP1, and further has a second feedback current path configured to allow a feedback current I1' to flow between the pin SNSN and the output end of the differential amplifier AMP1.

Moreover, the feedback current I1' is a duplication (a mirror current) of the feedback current I1, and respective current values thereof are set to be the same value (up to a maximum of 20 μA) in advance. As such, the differential input current difference ΔIBIAS can approximate zero by allowing the feedback current I1' having the same value as the feedback current I1 on the reference side of the different amplifier AMP1.

However, it is not necessary to strictly set the feedback current I1 and the feedback current I1' to be the same value; for example, an arbitrary offset may be assigned between the two.

In addition, the slope signal generator 15 does not include the differential amplifier AMP2 but includes a gm amplifier AMP2g. The gm amplifier AMP2g detects the sense voltage Vsns appearing between two terminals, without drawing a current from the pin SNSP or the pin SNSN. As such, in the slope signal generator 15 that does not demand a high current detection precision, the feedback current I2 can become zero by using the gm amplifier AMP2g requiring no feedback current control.

With the configuration above, even if the current limiting resistors RpP and RnP are correspondingly placed externally at the pin SNSP and the pin SNSN, respectively, the gain G of the current sense amplifier 16 is solely determined according to the ratio of the input resistor R1 to the output resistor R2, hence eliminating the reduced current detection precision (particularly temperature drift) in the LED driver IC 1.

In addition, using the externally placed current limiting resistors RpP and RpN, the electrostatic protection diode Desd (referring to FIG. 5) of the LED driver IC 1 may be protected from influences of the inrush currents ID1 and ID2. Thus, it is not necessary to provide two externally placed surge protection diodes DH and DL for every channel. As a result, reduced cost of the LED light module X can be achieved, and the area for mounting components on the substrate can also be reduced.

Moreover, in the on time setting unit 14 (referring to FIG. 1), a simple resistance dividing circuit is mostly used as a detection mechanism for a terminal voltage (=VLED) appearing in the pin SNSN. However, in view of the enhanced current detection precision, a source follower but not the resistance dividing circuit is more ideally in the on time setting unit 14. The source follower detects the terminal voltage appearing in the pin SNSN, without drawing a feedback current from the pin SNSP or the pin SNSN.

<LED Light Module (Sixth Embodiment)>

Figure 13:
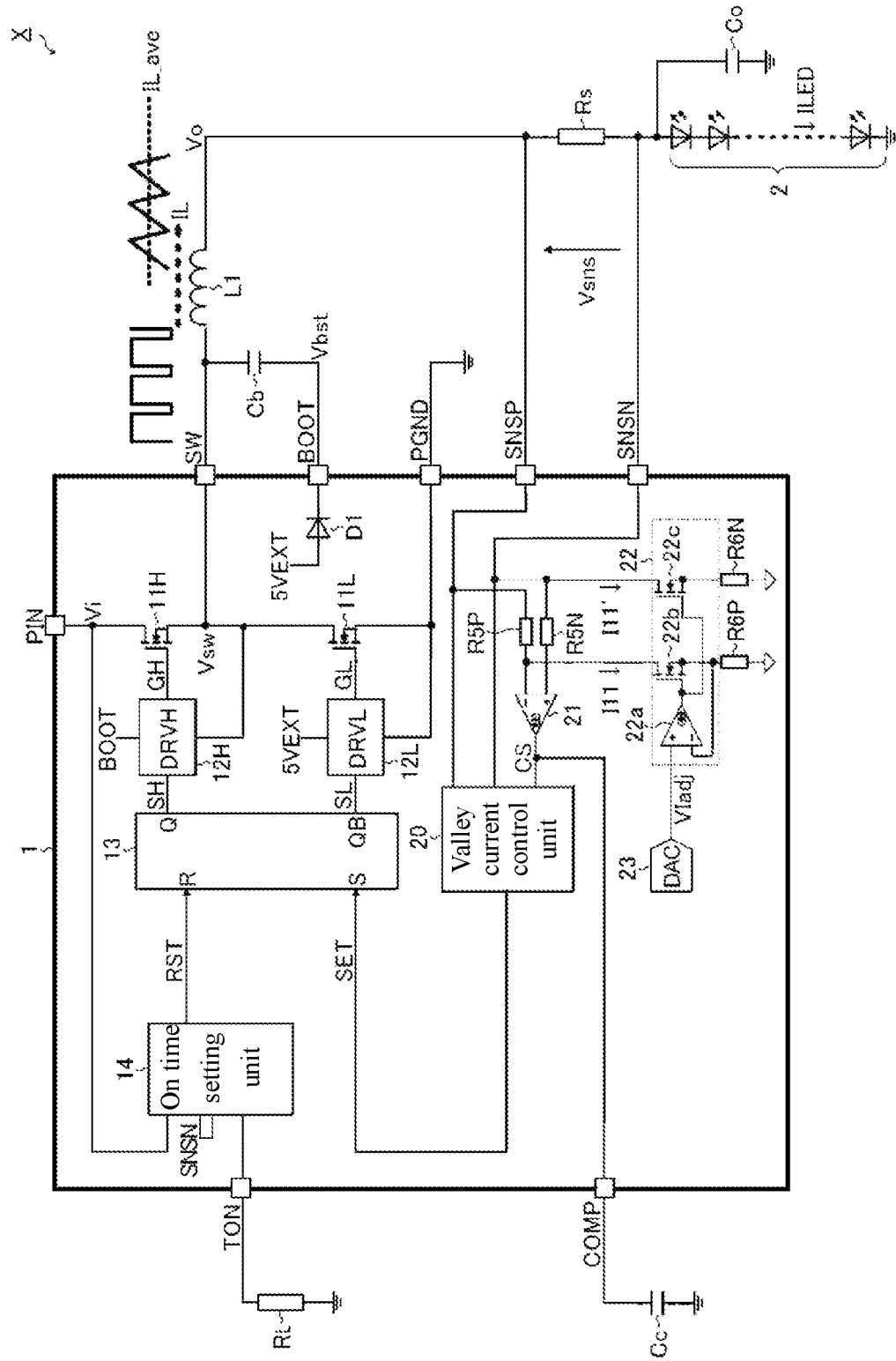
FIG. 13 is a diagram of an LED light module according to a sixth embodiment.

FIG. 13 shows a diagram of an LED light module according to a sixth embodiment. In the LED light module X of the sixth embodiment, the LED driver IC 1 does not include the constituting components 15 to 19 in FIG. 1, but includes a valley current control unit 20, a current sense amplifier 21, a V-I converter 22 and a DAC 23. In addition, input resistors R5P and R5N (for example, both 10 kΩ) and feedback resistors R6P and R6N (for example, both 140 kΩ) are integrated in the LED driver IC 1. These constituting components 20 to 23 can all be understood as constituting components of a current detection circuit.

The valley current control unit 20 performs bottom detection (valley detection) of the inductor current IL according to the sense voltage Vsns generated between two terminals of the sense resistor Rs and a current detection signal CS generated in the current sense amplifier 21, and accordingly generates the set signal SET.

The current sense amplifier 21 is a current output type differential amplifier including a floating input stage capable of amplifying an input signal by means of rail-to-rail. An inverting input end (−) of the current sense amplifier 21 is connected to a first terminal of the input resistor R5P. A second terminal of the input resistor R5P is connected to the pin SNSP. A non-inverting input end (+) of the current sense amplifier 21 is connected to a first terminal of the input resistor R5N. A second terminal of the input resistor R5N is connected to the pin SNSN. An output end of the current sense amplifier 21 is connected through the pin COMP to the phase compensation capacitor Cc.

The V-I converter 22 is a function module that converts a voltage signal (=a current adjusting voltage Vladj) into a current signal (=reference currents I11 and I11'), and includes an operational amplifier 22a, and NMOSFETs 22b and 22c.

The operational amplifier 22a controls respective gates of the NMOSFETs 22b and 22c, so that the current adjusting voltage Vladj input to the non-inverting input end (+) matches a terminal voltage (=I11×R6P) of the feedback resistor R6P input to the inverting input terminal (−). Thus, the reference current I11 flowing in the NMOSFET 22b and the reference current I11' flowing in the NMOSFET 22c respectively become current values (=Vladj/R6P) corresponding to a voltage value of the current adjusting voltage Vladj and a resistance value of the resistor R6P. That is to say, the gain of the V-I converter 22 is determine by the feedback resistor R6P.

The drain of the NMOSFET 22b is connected to the inverting input end (−) of the current sense amplifier 21 and the first terminal of the input resistor RSP. The source of the NMOSFET 22b is connected to the first terminal of the feedback resistor R6P and the inverting input end (−) of the operational amplifier 22a. A second terminal of the feedback resistor R6P is connected to the ground terminal. The gate of the NMOSFET 22b is connected to an output end of the operational amplifier 22a.

On the other hand, the drain of the NMOSFET 22c is connected to the second terminal of the input resistor R5N and the pin SNSN. The source of the NMOSFET 22c is connected to a first terminal of the feedback resistor R6N. A second terminal of the feedback resistor R6N is connected to the ground terminal. The gate of the NMOSFET 22c is connected to the output end of the operational amplifier 22a.

The DAC 23 converts a digital signal (for example, 10-bit, not shown in the drawing) into the analog current adjusting voltage Vladj.

In the current detection circuit of this embodiment, the current sense amplifier 21 amplifies a difference between the calibrated current adjusting voltage (=Vladj×R5P/R6P) and the sense voltage Vsns input to between the pin SNSP and the pin SNSN, and accordingly generates a current detection signal CS. A lower limit (valley detection value) of the inductor current IL is controlled according to the current detection signal CS. As a result, the output current ILED is adjusted to be Vladj×R5P/(R6P×Rs).

Figure 14:
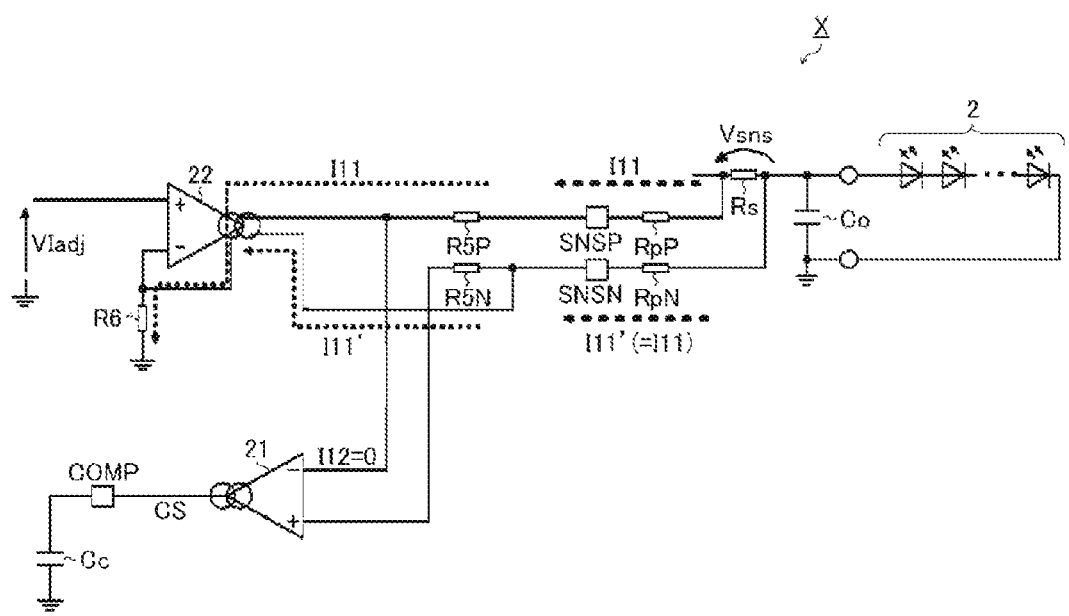
FIG. 14 is a diagram equivalently representing a current detection circuit according to the sixth embodiment.

FIG. 14 shows a diagram equivalently representing a current detection circuit according to the sixth embodiment. Moreover, the feedback resistor R6 in the drawing is understood as the feedback resistor R6P (or the feedback resistor R6N) in FIG. 13.

As shown in the drawing, in a current detection circuit of this embodiment, in order to generate a reference voltage (=the calibrated current adjusting voltage Vladj×R5P/R6) of the current sense amplifier 21, the reference current I11 needs to flow in the V-I converter 22. Thus, the current detection circuit of this embodiment includes a first reference current path. The first reference current path is configured to allow the reference current I11 to flow between the pin SNSP and a first output end (=the drain of the NMOSFET 22b) of the V-I converter 22.

However, in the configuration in which the first reference current I11 flows only in the current limiting resistor RpP placed externally at the pin SNSP, the reference voltage of the current sense amplifier 21 is offset by the amount of the voltage between the two terminals of the current limiting resistor RpP. Thus, the current detection circuit of this embodiment includes a second reference current path. The second reference current path is configured to allow the reference current I11' to flow between the pin SNSN and a second output end (=the drain of the MOSFET 22c) of the V-I converter 22. Moreover, the reference currents I11 and I11' may have the same value, or an arbitrary offset may be assigned between the two.

As such, according to the configuration that corrects the reference current I11 using the reference current I11', the reference current I11 is needed for generating the reference voltage of the current sense amplifier 21, and so even if the current limiting resistors RpP and RnP are correspondingly placed externally at the pin SNSP and the pin SNSN, respectively, the gain of the V-I converter 22 (and the reference voltage of the current sense amplifier 21) is solely determined according to the ratio of the input resistor R5P to the feedback resistor R6, hence eliminating the reduced current detection precision (particularly temperature drift) in the LED driver IC 1.

Moreover, in the current detection circuit of this embodiment, the current sense amplifier 21 functions as a gm amplifier. The gm amplifier amplifies a difference between the calibrated current adjusting voltage (=Vladj×R5P/R6) and the sense voltage Vsns without drawing the input current I2 from the pin SNSP and the pin SNSN, and accordingly generates the current detection signal CS.

<Other Variation Examples>

Further, in addition to the embodiments, various modifications may be made to the technical features disclosed by the present disclosure without departing from the scope of the technical inventive subject thereof. That is to say, it should be understood that all aspects of the embodiments are exemplary rather than limiting, and it should also be understood that the technical scope of the present disclosure is not limited to the embodiments, but includes all modifications of equivalent meanings of the claims within the scope.

The invention claimed is:

1. A semiconductor device, comprising:
a first current sense terminal;
a second current sense terminal;
a current detection circuit, comprising:
  a current output type differential amplifier;
  a first input resistor, configured to be connected between a first input end of the current output type differential amplifier and the first current sense terminal;
  a second input resistor, configured to be connected between a second input end of the current output type differential amplifier and the second current sense terminal;
  an output resistor, configured to be connected to an output end of the current output type differential amplifier;
  a first feedback current path, configured to allow a first feedback current to flow between the first input end and the output end of the current output type differential amplifier; and
  a second feedback current path, configured to allow a second feedback current to flow between the second current sense terminal and the output end of the current output type differential amplifier;
electrostatic protection diodes, respectively connected to the first current sense terminal and the second current sense terminal;
an output element; and
an output feedback control unit, driving the output element by a fixed on-time with a lower limit of current through the output element such that a current detection signal output from the current detection circuit matches a predetermined target value, wherein the output feedback control unit comprises:
  a slope signal generator, generating a slope signal;
  an error amplifier, generating an error signal that corresponds to an error between the current detection signal output from the current detection circuit and a predetermined reference signal;
  a comparator, comparing the slope signal and the error signal to generate a set signal;
  an on time setting unit, generating a pulse in a reset signal when a predetermined on time has elapsed from a pulse generation timing of the set signal;

a controller, generating a control signal for the output element in response to the set signal and the reset signal; and
a driver, generating a drive signal for the output element based on the control signal.

2. The semiconductor device of claim 1, wherein the first feedback current and the second feedback current have a same value.

3. The semiconductor device of claim 1, wherein an offset is applied to the first feedback current and the second feedback current.

4. The semiconductor device of claim 1, wherein the slope signal generator comprises a gm amplifier configured to detect a sense voltage appearing between the two terminals without drawing a current from the first current sense terminal and the second current sense terminal.

5. The semiconductor device of claim 4, wherein the on time setting unit comprises a source follower configured to detect a terminal voltage appearing in the second current sense terminal without drawing a current from the first current sense terminal or the second current sense terminal.

6. A module, comprising:
the semiconductor device of claim 4;
an inductor, a sense resistor and a load, connected in series with the output element;
a first current limiting resistor, connected between the first current sense terminal and the sense resistor; and
a second current limiting resistor, connected between the second current sense terminal and the sense resistor.

7. The semiconductor device of claim 1, wherein the on time setting unit comprises a source follower configured to detect a terminal voltage appearing in the second current sense terminal without drawing a current from the first current sense terminal or the second current sense terminal.

8. A module, comprising:
the semiconductor device of claim 7;
an inductor, a sense resistor and a load, connected in series with the output element;
a first current limiting resistor, connected between the first current sense terminal and the sense resistor; and
a second current limiting resistor, connected between the second current sense terminal and the sense resistor.

9. A semiconductor device, comprising:
a first current sense terminal;
a second current sense terminal;
a current detection circuit, comprising:
a current output type differential amplifier;
a first input resistor, configured to be connected between a first input end of the current output type differential amplifier and the first current sense terminal;
a second input resistor, configured to be connected between a second input end of the current output type differential amplifier and the second current sense terminal;
a voltage-current (V-I) converter, converting a voltage signal into a current signal;
a feedback resistor, configured to determine a gain of the V-I converter;
a first reference current path, configured to allow a first reference current to flow between the first current sense terminal and a first output end of the V-I converter; and
a second reference current path, configured to allow a second reference current to flow between the second current sense terminal and a second output end of the V-I converter;
electrostatic protection diodes, respectively connected to the first current sense terminal and the second current sense terminal;
an output element; and
an output feedback control unit, driving the output element by a fixed on-time with a lower limit of current through the output element such that a current detection signal output from the current detection circuit matches a predetermined target value, wherein the output feedback control unit comprises:
a slope signal generator, generating a slope signal;
an error amplifier, generating an error signal that corresponds to an error between the current detection signal output from the current detection circuit and a predetermined reference signal;
a comparator, comparing the slope signal and the error signal to generate a set signal;
an on time setting unit, generating a pulse in a reset signal when a predetermined on time has elapsed from a pulse generation timing of the set signal;
a controller, generating a control signal for the output element in response to the set signal and the reset signal; and
a driver, generating a drive signal for the output element based on the control signal.

10. A module, comprising:
a semiconductor device, comprising:
a first current sense terminal;
a second current sense terminal;
a current detection circuit, comprising:
a current output type differential amplifier;
a first input resistor, configured to be connected between a first input end of the current output type differential amplifier and a first current sense terminal;
a second input resistor, configured to be connected between a second input end of the current output type differential amplifier and the second current sense terminal;
an output resistor, configured to be connected to an output end of the current output type differential amplifier;
a first feedback current path, configured to allow a first feedback current to flow between the first input end and the output end of the current output type differential amplifier; and
a second feedback current path, configured to allow a second feedback current to flow between the second current sense terminal and the output end of the current output type differential amplifier;
electrostatic protection diodes, respectively connected to the first current sense terminal and the second current sense terminal;
an output element; and
an output feedback control unit, driving the output element by a fixed on-time with a lower limit of current through the output element such that a current detection signal output from the current detection circuit matches a predetermined target value;
an inductor, a sense resistor and a load, connected in series with the output element;
a first current limiting resistor, connected between the first current sense terminal and the sense resistor; and
a second current limiting resistor, connected between the second current sense terminal and the sense resistor.

11. The module of claim 10, wherein the load comprises a light emitting diode element.

12. The module of claim 11, further comprising a matrix manager configured to arbitrarily switch the number of series stages of the light emitting diode element.

13. A current detection circuit, comprising:
- a current output type differential amplifier;
- a first input resistor, configured to be connected between a first input end of the current output type differential amplifier and a first current sense terminal;
- a second input resistor, configured to be connected between a second input end of the current output type differential amplifier and a second current sense terminal;
- an output resistor, configured to be connected to an output end of the current output type differential amplifier;
- a first feedback current path, configured to allow a first feedback current to flow between the first input end and the output end of the current output type differential amplifier; and
- a second feedback current path, configured to allow a second feedback current to flow between the second current sense terminal and the output end of the current output type differential amplifier;
- wherein the first feedback current and the second feedback current are generated simultaneously.

* * * * *